United States Patent [19]

Koyanagi

[11] Patent Number: 4,593,414
[45] Date of Patent: Jun. 3, 1986

[54] PROGRAMABLE CHANNEL SELECTING SYSTEM
[75] Inventor: Yukio Koyanagi, Katano, Japan
[73] Assignee: Matsushita Electric Industrial Co., Ltd., Osaka, Japan
[21] Appl. No.: 568,240
[22] PCT Filed: Apr. 15, 1983
[86] PCT No.: PCT/JP83/00120
    § 371 Date: Dec. 14, 1983
    § 102(e) Date: Dec. 14, 1983
[87] PCT Pub. No.: WO83/03726
    PCT Pub. Date: Oct. 27, 1983
[30] Foreign Application Priority Data
    Apr. 19, 1982 [JP] Japan .................. 57-65897
[51] Int. Cl.$^4$ ............................. H04B 1/16
[52] U.S. Cl. ..................... 455/186; 455/181; 369/19
[58] Field of Search .......... 455/181, 185, 186; 369/19

[56] References Cited
U.S. PATENT DOCUMENTS
4,162,513 7/1979 Beyers, Jr. et al. ............ 455/181
4,228,543 10/1980 Jackson ....................... 455/181

FOREIGN PATENT DOCUMENTS
0042600  5/1982 European Pat. Off. .
2624733 12/1977 Fed. Rep. of Germany .
  46408 12/1978 Japan .
  84423  9/1979 Japan .
  27729  2/1980 Japan .................... 455/181

OTHER PUBLICATIONS
PCT Publication, WO81/02808, 10/1981.
PCT Publication, WO80/02083, 10/1980.

Primary Examiner—Jin F. Ng
Attorney, Agent, or Firm—Wenderoth, Lind & Ponack

[57] ABSTRACT

A system for obviating the special operation needed for storing a program in memories in a channel selecting system used in television sets, etc., which is adapted to make the control for selecting specified channels at specified times, following a program which has been preliminarily stored in the memories, by writing into the memories from the channel control means the state of channel selection unmodified, as the program, which is based on the channel selecting operation actually performed by the user, using the commanding means during normal real time operation, as a way of storing the program in the memories.

2 Claims, 11 Drawing Figures

PROGRAMABLE CHANNEL SELECTING SYSTEM

BACKGROUND OF THE INVENTION

The present invention relates to a programable channel selecting system used for television image receivers, etc., in which the channels to be selected by a tuner are stored in memories according to a preliminarily set program and the channel selection is controlled by this stored program.

In conventional programable channel selecting system, in storing data of the channels to be selected in memories for 1 week, for example, by operating a keyboard, etc., successive inputs are provided, with the time points (hours and minutes) at which respective channels are to be switched corresponded to the channels to be selected, while switching the memories' write addresses, and, then, the data is to written in the respective channels.

With this system, the writing operation had to be performed by a special procedure quite difference from the normal channel selecting operation. This procedure has been troublesome and complicated.

SUMMARY OF THE INVENTION

The present invention provides a programable channel selecting system having relatively small capacity memories but practical operability, with the daily channel selecting operations, when being performed, entered as program data into the memories as they are, on the basis of the periodicity with a definite cycle time (e.g., one week) of broad cast television programs, etc.

Thus according to the programable channel selecting system of this invention, in a programable channel selecting system used with television sets, etc., which provides such a control as to select any specified channels at any specified times, the special operation for storing the program in the memories is obviated by storing into the memories the state of channel selections as it is as a program based on the channel selecting operations which have been actually conducted by the user during his normal real time operations over one week, for example.

DESCRIPTION OF THE PREFERRED EMBODIMENT

Figure 1:
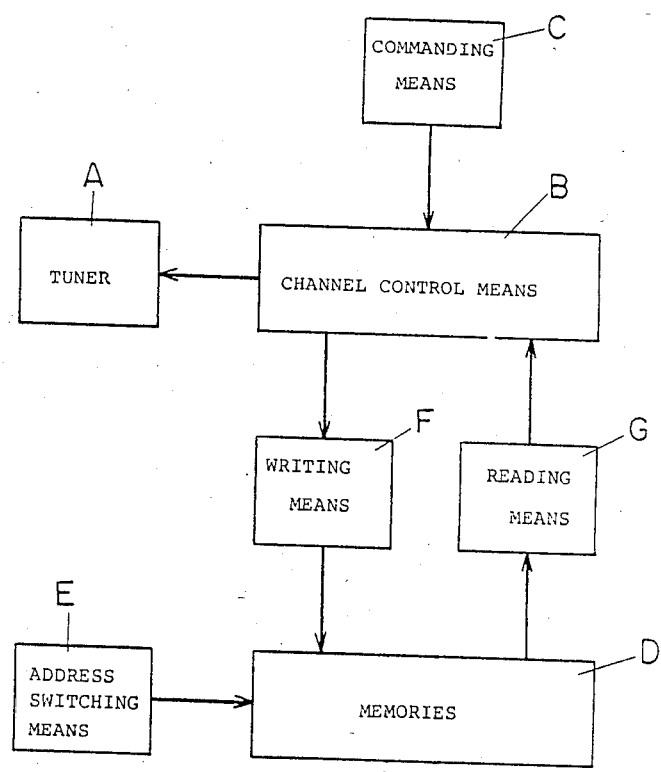
FIGS. 1 and 2 are block diagrams showing the construction of a programable channel selecting system embodying this invention.

A programable channel selecting system for television sets embodying this invention is described hereunder with reference to accompanying drawings:

First, FIG. 1 shows the construction of this system by utilizing function blocks. Referring to this diagram, (A) designates a tuner for selecting the television channel to be received and (B) is a channel control means for producing control signals to be fed to the tuner (A) for controlling the channel selection. This channel control means (B) includes a remote control signal producing means which makes use of a microcomputer and a tuner control means for controlling the tuner by the remote control signals.

The letter (C) designates a commanding means including a keyboard which is actually operated by the user at the time of manual switching, for entering into the channel control means (B) the channel data which represent the channels to be selected, in order to allow manual the channel selection switching by the tuner.

Further, (D) represents a memory for storing for one week, for example, program data available at 15 minutes intervals, for example, for automatic switching to be done by the program between channels through selection by the aforementioned tuner (A). For example, 672 addresses are provided in the memories.

The letter (E) represents an address switching means for specifying write/read addresses in the aforementioned memories (D) by switching at definite time intervals, for example, every 15-minutes, and effecting address designations with certain time period cycles; (F) a writing means for receiving from the channel controlling means (B) the channel data which was entered by the commanding means (C) at the aforementioned manual switching times and which represent the channels that have been selected by the tuner through the channel controlling means (B) and, then, writing them as program data in the memories (D) at the addresses specified at those times so as to store them there, and (G) a reading means for reading out of the memories (D) the aforementioned program data at definite time intervals, at read times every hour, for example, 0, 15, 30 and 45 minutes and automatically switching between channels through selection by the tuner (A) on the basis of the aforementioned program data by entering the channel data into the channel controlling means (B) on the basis of the program data.

These address switching means (E), writing means (F) and reading means (G) can be operated by means of a microcomputer used in the channel controlling means (B).

As noted above, in this system, the channel to be selected is automatically switched in accordance with the program by controlling with a remote control the channel to be selected by the tuner and controlling the remote controlling means installed inside the channel controlling means (B) by means of the program data read out of the memories (D). On the other hand, memories (D) for switching write/read addresses with a definite cycle time (called step time) are used as the memories for storing program data. This step time is set at 15 minutes in this instance, so that the switchings take place at 0, 15, 30 and 45 minutes every hour. The address designations in the memories (D) are to be repeated with 1 week as one cycle time. The timing relationships between the times for the reset of addresses, switching of addresses, read, write and write permission in the memories (D) for programming are very important.

In particularly describing the aforementioned example, the timings for reading from the memories (D) shall be set at 0, 15, 30 and 45 minutes every hour. Since the step time is 15 minutes, as above-described, the memory read times must exactly coincide with the times abovementioned at the address reset times.

Since, generally, the manual channel switching operations of a television set in use are thought to occur concentrically around the read times, for the broadcasting programs change at either 0, 15, 30 or 45 minutes every hour, the data are once written in the selecting registers in the RAM in the microcomputer for remote control and, thereafter, the final channels selected are written in the memories (D). Accordingly, if channels have been manually switched many times around the read times, for example, each 5 minutes write permissive time, the channel selecting data will be renewed in the channel selecting registers one after another. After the write permissive times have ended, the data in the channel selecting registers will be written in the memories (D) for programming.

On the other hand, the switching between addresses needs to be done before reading, but if no channel selecting register is provided, it needs to be done before the write permissive time (thus, 5 minutes before read time).

Figure 2:
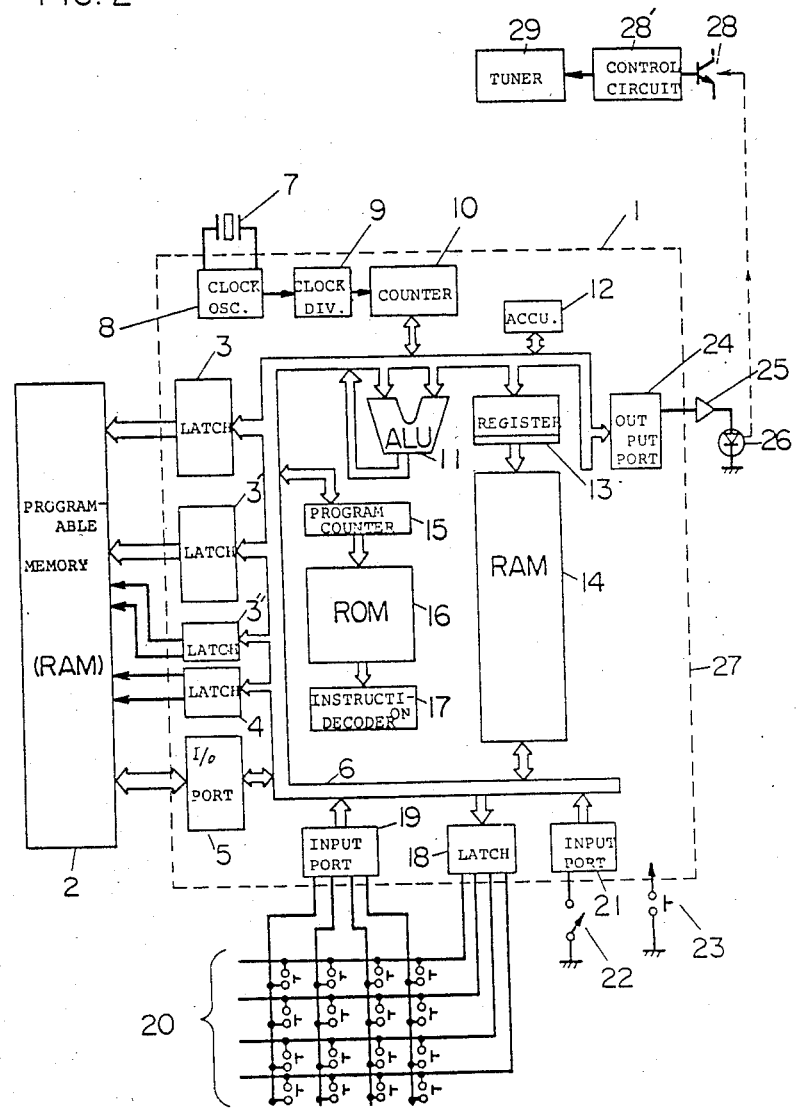

FIG. 2 is a block diagram showing an embodiment of this invention. The numeral 1 denotes a microcomputer; 2 is a programable memories comprising 4 1K bit RAMs; 3, 3' and 3" are address output latches; 4 is a latch for delivery of a WE (write enable) signal and write/read signals; 5 is a I/O port; and 6 is an internal bus line. The numeral 7 designates a quartz oscillator crystal used as a clock standard; 8 is a clock oscillator; 9 is a clock divider; 10, counter; 11 is a ALU; 12 is an accumulator; 13 is a register stack pointer; 14 is a RAM; 15 is a program counter; 16 is a ROM; 17 is an instruction decoder; 18 is an output latch; 19 is an input port; 20 is a keyboard; 21 is an input port; 22 is a mode changeover switch; 23 is a reset switch; 24 is an output port; 25 is an amplifier used for generating a remote control signal; and 26 is an infrared diode for delivery of the remote control signal. Elements inside the dashed line are located on the chip of the microcomputer 1. The power source is not shown in this diagram. The numeral 28 stands for a photo-diode used for receiving the remote control signal; 29 is a tuner; and 28', is a control circuit used for controlling the tuner's 29 channel selection by the remote control signal.

Referring to FIG. 2, when the mode changeover switch 22 is opened to provide the write mode, a keyboard 20 used as the commanding means (C) is a keyboard for channel command by the manually operated remote control; by specifying the channel by operating one of the keys, a pulse code row of the types corresponding to the respective channels to be selected is produced inside the microcomputer 1, is then delivered from the output port 24 to the amplifier 25 for generating the remote control signal, thereby causing the operation of delivering infrared remote control signals by driving the diode 26. As this remote control signal is received by the phototransistor 28 and fed to the tuner control circuit 28' the channel designated for actual entrance at that time by the command from the keyboard 20 is selected by the tuner 29. The arrangement of elements to this tuner 28' is included in the channel controlling means (B) in FIG. 1.

On the other hand, the output from the clock oscillator 8 is divided by the divider 9 and counter 10, to allow outputs to occur every 0.5 seconds.

By making use of the outputs, timing signals are produced on a software basis inside the microcomputer 1. New, assuming that the outputs occur every 0.5 seconds, and assuming that the step time for address switching by the address switching means E is 15 minutes and one cycle time for addresses in the memories 2 is 7 days, then the last channel selection data within the write permissive times, or 5 minutes before and after the read times, are written in the memories 2. The writing into the memories 2 shall be made immediately after the ending of the write permissive time and the address switching timing shall be just before the ending of the write permissive time.

Figure 3:
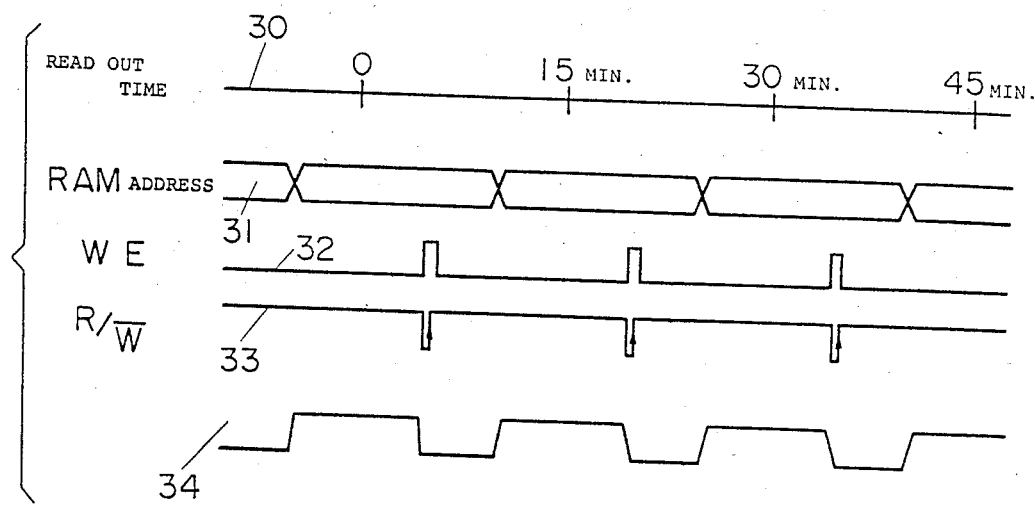
FIGS. 3 and 4 are timing charts illustrating the operation of this system.
Figure 4:
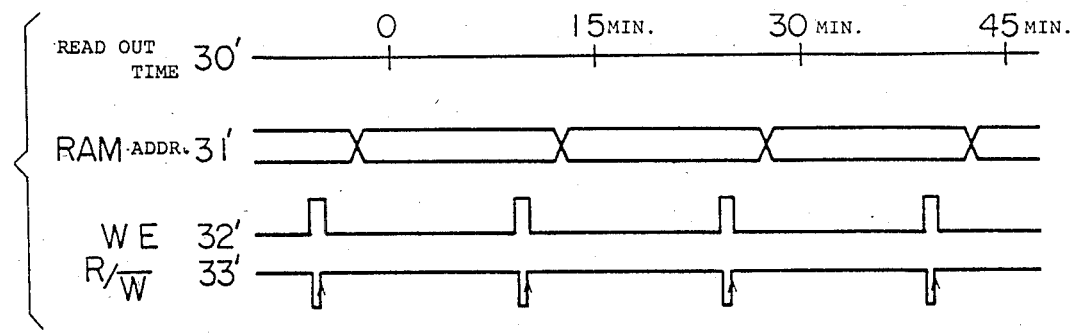

The timing relationships at these times are shown in the time chart in FIG. 3.

The numeral 30 represents the read times synchronized with the real times, which may be set in agreement with the latter by depressing the reset switch 23 at correct times: 0, 15, 30 and 45 minutes. The numeral 31 in FIG. 3 is the memories signal; and 32 is the WE (write enable) signal of memories 2; when this signal is "1", the writing operation is enabled. The numeral 33 signifies the R/W (read/write) signal, which, when rising from "0" to "1", writes the signal on the data bus into the aforementioned memory 2. The signal 34 has represented by "1" the time range for writing the channel selecting data the channel selecting registers (which will be described later; refer to FIG. 7) inside the microcomputer. The narrower the range, the more properly may the will of the operator be reflected. Too narrow a range, however, may result in lost data. If it is widened forwardly, the data entered one step before may be mixed in. If it is widened backwardly, the result of selection will be reflected stronger. However, this merely indicates one direction of selection.

Figure 5:
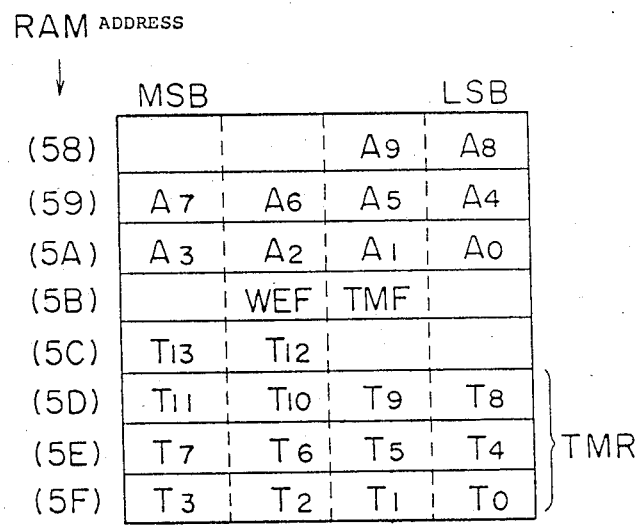
FIG. 5 is a chart showing positions and addresses of counter flags related to address counters in a RAM inside a microcomputer.

FIG. 5 is a table showing the arrangement of address switching counters laid out in part of the RAM 14 inside the microcomputer 1 and their addresses.

Figure 6A:
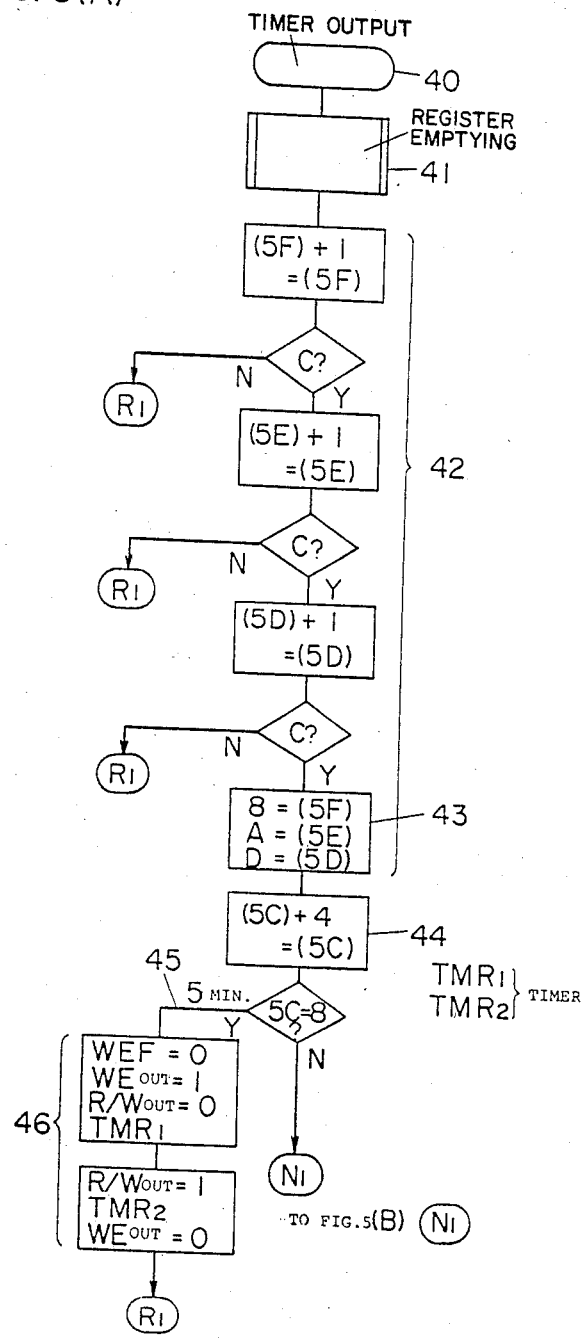
FIGS. 6 (A) and (B), is a flowchart representing the address counters and the formation of a variety of timings in this system.
Figure 6B:
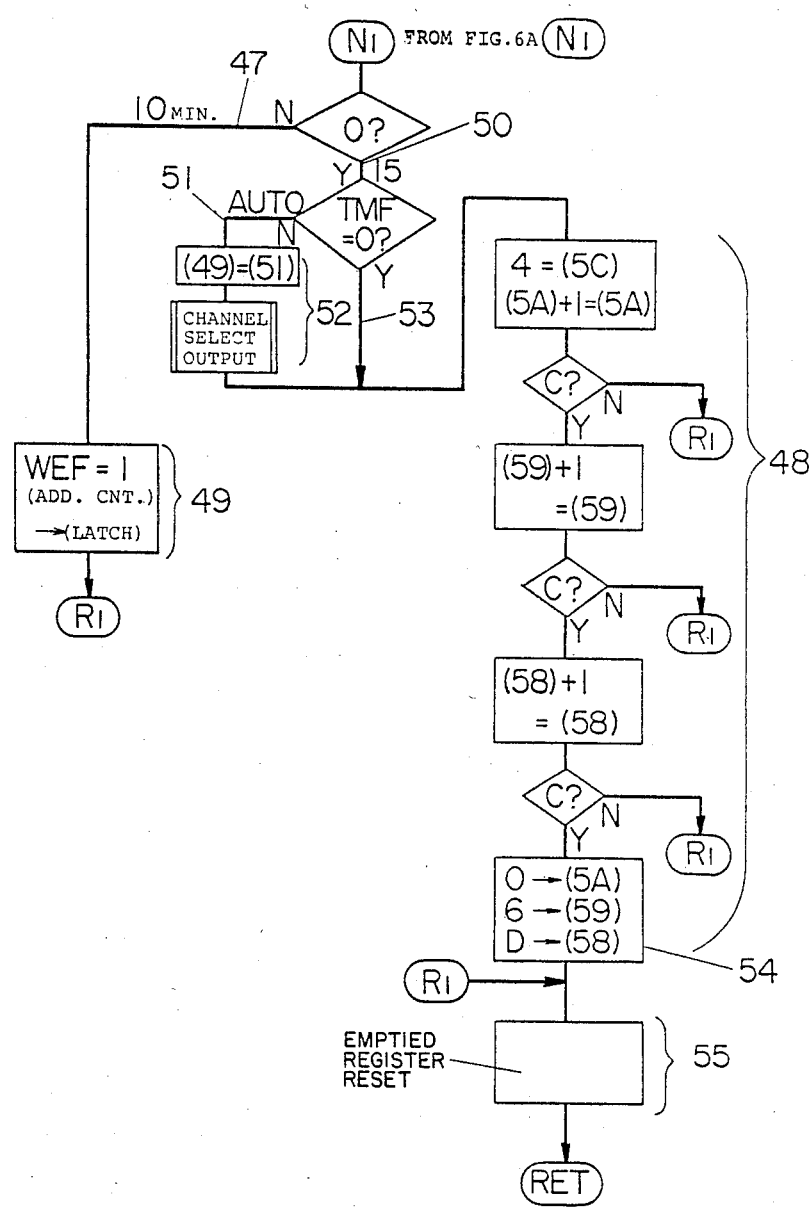

FIGS. 6 (A) and (B), is a flowchart showing their operation. $T_0$–$T_{11}$ in FIG. 5 represent 12 bit counters which count 600 input signals at 0.5 second intervals on a software basis for a time length of 5 minutes. $T_{12}$ and $T_{13}$ stand for 2 bit counters, which count 3 5-minute inputs for the total 15 minutes. TMF indicates a timer mode flag, which will be set to "1", when the mode changeover switch 22 in FIG. 2 is switched to Auto mode (a mode in which automatic channel selection is made, based on the channel selecting data from RAM, as the read time has arrived), but to "0", when it is switched to Man mode (a mode in which automatic channel selection is prohibited). WEF Denotes a flag which gives "1", when the write time signal 34 in FIG. 2 gives "1". $A_0$–$A_9$ Show address counters, which count 672 addresses for 7 days at 15 minute steps.

In the flowchart of FIG. 6 (A), 40 designates the start of outputs by the timers, which occur every 0.5 seconds. When a timer output has occurred, first, each present register is emptied (41) and the 5 minute counters 42 (addresses 5F-5D) have their counts raised by one count. This system is constructed on a software basis such that the 5 minute counters 42 are reset, after receiving 600 counts (43).

When the 5 minute counters have been reset, a 15 minute counter 44 will have its count raised by one count. When the 15 minute counter has counted 5 minutes (45), WEF will be reset and WE output and R/W be produced (46). TMR1 and TMR2 signify timers formed on a software basis.

Subsequently, the steps of FIG. 6 (B) are effected. Thus, when the 15 minute timer has recorded 10 minutes (47), WEF will be set and the numbers counted in the address counters 48 will be delivered at address output latches 3, 3′ and 3″ (49). When the 15 minute timer has run 15 minutes (50) and the mode changeover switch is under Auto mode (51), channel selection signals are produced (52). When the mode switch is under Man (53), the channel selection signals will not be issued. Then, the address counters 48 will have their counts raised by one count. When the address counters 48 have received 672 counts, they will be reset (54).

On the whole returning route from the aforementioned operations, the initially emptied registers will be returned (55), the outputs completed and the former program resumed.

Figure 7:
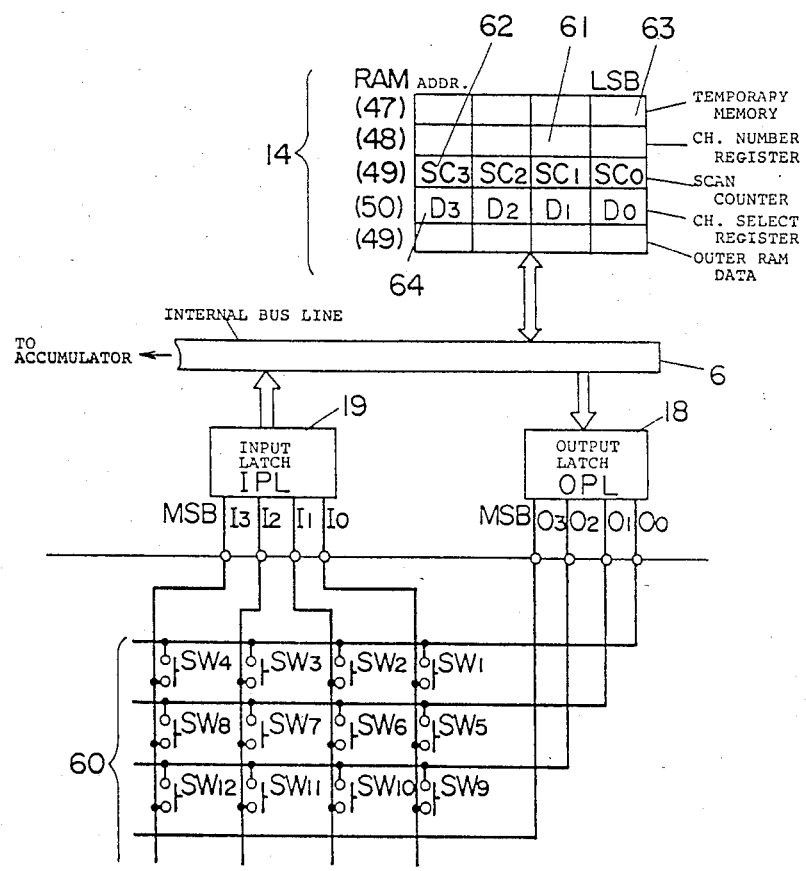
FIG. 7 is a partial block diagram and positions and addresses of register flags related to channel selecting resisters of the RAM.

In the following, the flow of channel selecting data is described: FIG. 7 is a block diagram showing how the channel selecting data is taken in and FIGS. 8 (A) and (B) are a flow chart showing the operation. Switches $SW_1$-$SW_{12}$ in FIG. 7 designate a channel selection button group, by which "1"-"C" in hexadecimal notation in correspondence with the switches $SW_1$-$S_{12}$ are written as channel number data in channel number registers 61. Scan counters 62 perform a scanning of the keys by successively turning to "1" each one of bits of output latch 18. The circuits of FIG. 7, exclusive of the keyboard 60, are all placed on the chip of the microcomputer 1. The numeral 14 represents the RAM and element 19 is an input port. These elements and the ALU 11 and the accumulator 12 are connected through a bus 6.

Figure 8A:
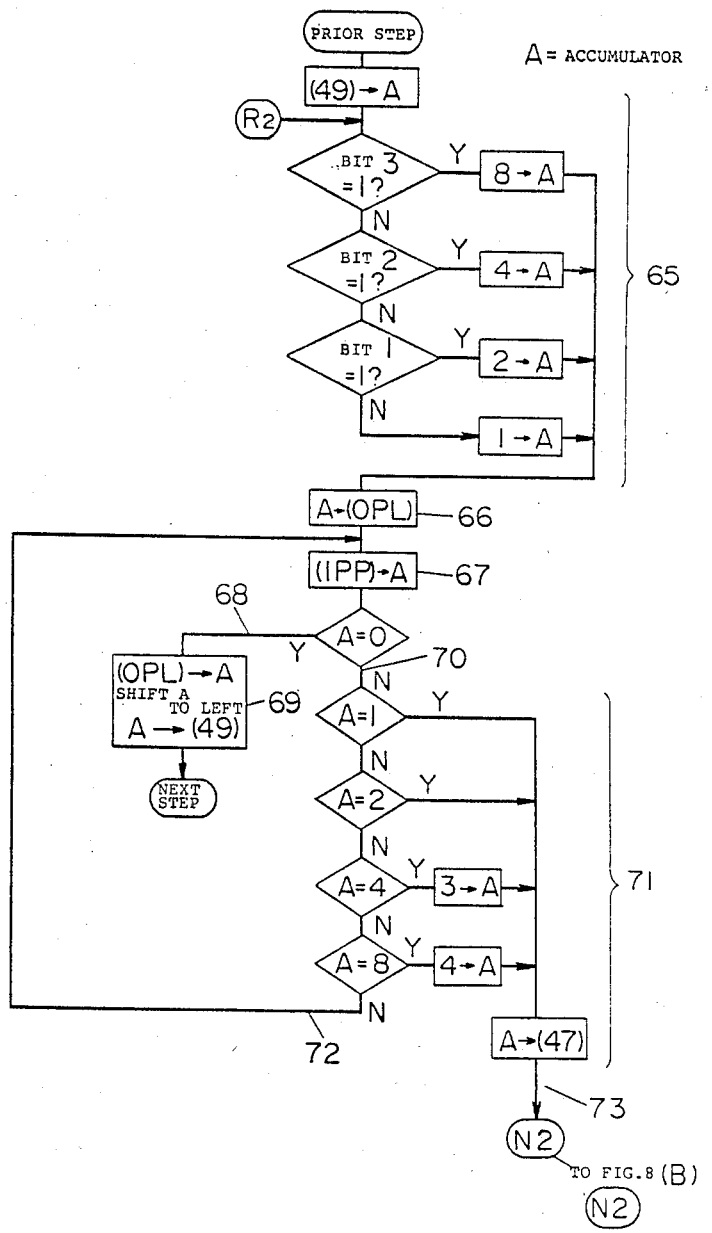
FIG. 8 (A) and (B), is a flowchart showing the channel selecting operation of this system.
Figure 8B:
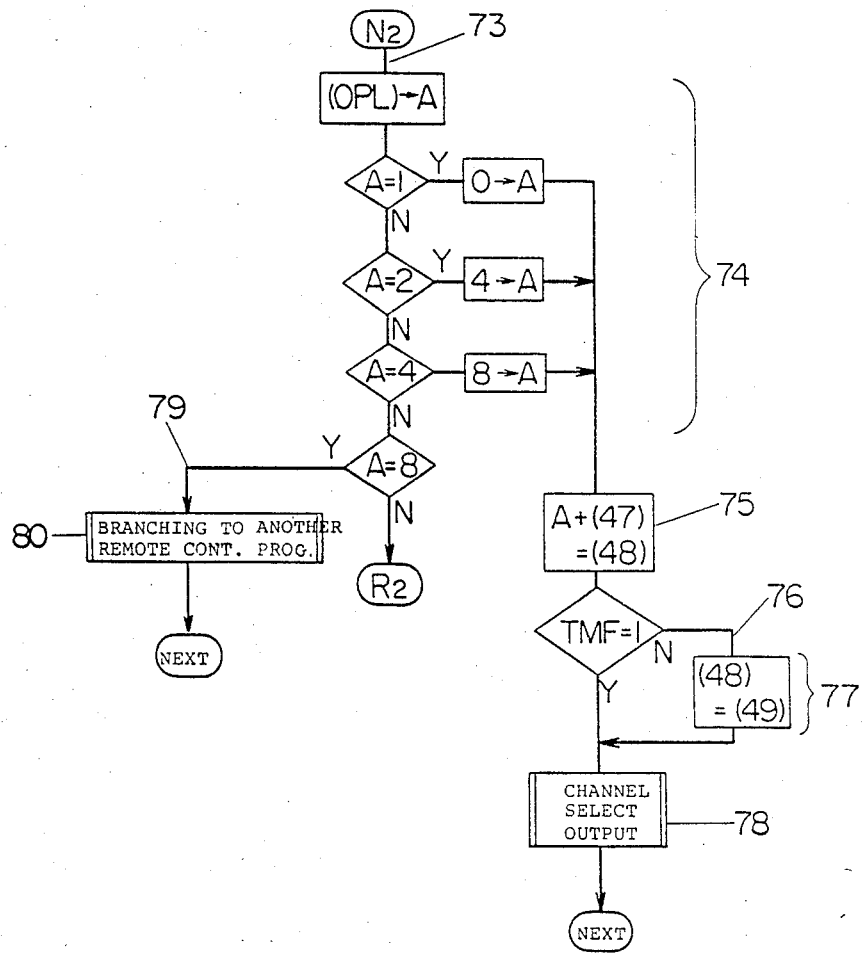

The flow chart of FIGS. 8, (A) and (B), in contrast to that of FIGS. 6 (A) and (B), which is operated by outputs, is composed as part of a whole program loop. In this chart, detailed parts, such as a chattering preventer, etc., are not included. The numeral 65 represents a program for always making only one bit in the output latch 18 "1", the highest level bit only remaining, when a plurality of bits are "1", but the lowest level bit giving "1", when all bits are "0". Then, this signal is delivered from the output latch 18 by step 66, while the signal from the input port 19 is taken into the accumulator 12 (67).

If there is no input (or when not a key has been depressed) (6′) the scan counter 62 will be shifted one place to left (69), and then the program proceeds to the next step. When inputs have occurred (70), the input values "1", "2", "4" and "8" (binary coded numbers) from the input port 19, respectively, are converted into "1", "2", "3" and "4" (decimally coded numbers) which are, then, written into temporary memories 63 (71). If a plurality of inputs have been made, they will be returned through a loop of (72) and data will be again taken in (67).

After entering inputs into temporary memories 63 (73), the data in the output latch 18 is judged and "0", "4" and "8" are put in the accumulator 12 (74) in correspondence with the data from the output latch 18, "1", "2" and "4", and with the content of the temporary memory 63 adder, are received in the channel number registers 61 (75). If the mode is Man (76), this data will be written in the channel selection registers (77). In accordance with this data, channel selecting signals will be delivered (78). When the data of the output latch 18 above-mentioned is 8 (79), this means that keys other than those for channel selection have been depressed; the flow will be branched to other remote control treatments (80). In this way, the expected operation may be performed with the circuit composition of FIG. 2.

Figure 9:
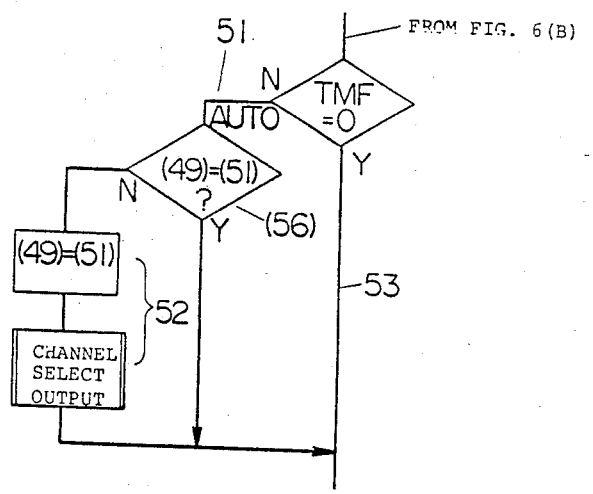
FIG. 9 is a flowchart of the part which prohibits the automatic operation, when the channel is identical with that which has been just previously received by this system.

Besides, this system may be so arranged that when, the channel selection data from RAM during the read time shown in FIG. 6 (B) and the data of the channel number registers 61 are in agreement, as compared in FIG. 9 (56), the channel selecting operation will not be run.

Or, the system may be composed such that the channel selecting data may be obtained which can be programed only when same channels have been received continuously over n weeks, by adding to the program RAM such a judgement bit as effectively enters the channel selecting data into the addresses specified in the memories, only when such channel selecting data are entered that select same channels to same addresses over n cycles (n is an integer of 2 or more) of the address designation in the memories, for example, over n weeks.

As described in the foregoing, the programable channel selecting system of this invention enables program input of channel selection to be made under almost natural operating condition, obviating special program entering operation. Accordingly, this invention can provide a programable channel selecting system which is optimally useful, as used in television or radio receivers.

What is claimed is:

1. A programmable channel selecting system comprising a tuner for selecting the channel to be received, a channel control means for producing control signals which are input to said tuner so as to control the channel selection thereof, a manually operated commanding means for manually switching the channel received by said tuner and for entering channel data into said channel control means which represent the channels to be selected, memories for storing said channel data, an address switching means for specifying write/read addresses in said memories which are switched at definite time intervals and for effecting address designations at a predetermined time period of a timing cycle, a writing means for writing into and storing as program data in the addresses specified at switching times in said memories said channel data which have been entered by said commanding means at manual switching times and which represent said channels selected by said tuner, and a reading means for reading out from said memories said program data at read times, which are set at predetermined time intevals and, then, entering said channel data into said channel controlling means in accordance with said program data, thereby automatically switching said channel as selected by said tuner on the basis of said program data, wherein said writing means is adapted to write channel data which has been selected during a last predetermined time period after the time when said channel to be selected is switched but before a next time period following said last predetermined time period when said channel to be selected next is switched, said channel data being written into an address of said memories from which said data is to be read out by said reading means at the read time.

2. A programable channel selecting system according to claim 1, wherein said writing means is adapted to write said channel data into said memories only at the addresses where the same channel data have been entered over n cycles, wherein n is an integer which is equal to or greater than 2, of said addresses designation effected by said address switching means.

* * * * *